United States Patent [19]
Kwon et al.

[11] Patent Number: 5,768,215
[45] Date of Patent: Jun. 16, 1998

[54] INTEGRATED CIRCUIT MEMORY DEVICES HAVING INTERLEAVED READ CAPABILITY AND METHODS OF OPERATING SAME

[75] Inventors: Seok-Chun Kwon; Jin-Ki Kim, both of Seoul, Rep. of Korea

[73] Assignee: Samsung Electronics Co., Ltd., Suwon, Rep. of Korea

[21] Appl. No.: 722,478

[22] Filed: Sep. 27, 1996

[30]  Foreign Application Priority Data

Sep. 28, 1995 [KR] Rep. of Korea ............... 1995-32483

[51] Int. Cl.⁶ ............................................. G11C 8/00
[52] U.S. Cl. ..................... 365/238.5; 365/185.12; 365/189.05; 365/239
[58] Field of Search ...................... 365/238.5, 185.11, 365/185.12, 189.05, 239

[56]  References Cited

U.S. PATENT DOCUMENTS

| | | | |
|---|---|---|---|
| 5,231,603 | 7/1993 | Luhramann | 365/238.5 X |
| 5,297,029 | 3/1994 | Nakai et al. | 365/238.5 |
| 5,327,395 | 7/1994 | Sugiura et al. | 365/238.5 |
| 5,473,563 | 12/1995 | Suh et al. | 365/185.13 |
| 5,541,879 | 7/1996 | Suh et al. | 365/185.22 |
| 5,546,341 | 8/1996 | Suh et al. | 365/185.33 |
| 5,625,590 | 4/1997 | Choi et al. | 365/185.11 X |
| 5,671,178 | 9/1997 | Park et al. | 365/185.12 X |

OTHER PUBLICATIONS

Betty Prince et al., *Semiconductor Memories. A Handbook of Design, Manufacture and Application*, Second Edition, John Wiley & Sons Ltd., pp. 185–187 and 603–604, 1991.

*Primary Examiner*—Huan Hoang
*Attorney, Agent, or Firm*—Myers Bigel Sibley & Sajovec

[57]  ABSTRACT

Integrated circuit memory devices having interleaved read capability include read controllers and subpage data buffers for performing interleaved read operations. These read operations are performed by downloading respective subpages of memory while simultaneously serially transmitting previously downloaded subpages of memory so that consecutive pages of memory data can be serially transmitted as a continuous string of data without the occurrence of breaks therebetween caused by stand-by holding periods. These memory devices typically contain an array of memory cells arranged as a plurality of pages (e.g., rows) of predetermined width coupled to a respective plurality of word lines and a plurality of columns of memory cells electrically coupled to a respective plurality of bit lines. First and second subpage buffers may also be provided for temporarily storing subpages of data read from addressed subpages of memory cells. The read controller is also provided for initiating transfer of a previously read subpage of data from one of the first or second subpage buffers to an I/O data buffer, while simultaneously initiating an interleaved page read operation to read another subpage of data from memory into the other of the first or second subpage buffers. The interleaved page read operation is preferably performed to prevent the occurrence of breaks in the transfer of data to the I/O data buffer when multiple pages of data are being downloaded and serially transmitted to external the memory device.

12 Claims, 11 Drawing Sheets

INTEGRATED CIRCUIT MEMORY DEVICES HAVING INTERLEAVED READ CAPABILITY AND METHODS OF OPERATING SAME

FIELD OF THE INVENTION

The present invention relates to integrated circuits and methods of operating integrated circuits, and more particularly to integrated circuit memory devices and methods of operating integrated circuit memory devices.

BACKGROUND OF THE INVENTION

Semiconductor memory devices for storing data can typically be categorized as either volatile memory devices or nonvolatile memory devices. Volatile memory devices lose their stored data when their power supplies are interrupted, however nonvolatile memory devices retain their stored data even when their power supplies are interrupted. Thus, nonvolatile memory devices are widely used in applications where the possibility of power supply interruption is present.

Conventional nonvolatile memory devices include a type of electrically erasable programmable read only memory (EEPROM) device typically referred to as a flash EEPROM device. Flash EEPROM devices typically include a semiconductor substrate of first conductivity type (e.g., P-type), spaced source and drain regions of second conductivity type (e.g., N-type) in the substrate, a channel region at a face of the substrate, between the spaced source and drain regions, a floating gate for storing charge carriers when the device is programmed and a control gate which overlies the floating gate, opposite the channel region. Operation of a flash EEPROM device is typically divided into three modes including programming, erasing and reading.

Programming of a flash EEPROM device is typically achieved by biasing the drain region to a first positive bias, relative to the source region, and biasing the control gate to a second positive bias which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer which separates the floating gate from the channel region. This electric field attracts the hot electrons and accelerates them toward the floating gate, which is disposed between the control gate and the channel region, by a process known as tunneling. The floating gate then accumulates and traps the accumulated charge. Fortunately, the process of charging the floating gate is self-limiting. The negative charge that accumulates on the floating gate reduces the strength of the electric field in the tunneling oxide layer to the point where it is no longer capable of accelerating "hot" electrons from the drain side of the channel region.

As will be understood by those skilled in the art, the accumulation of a large quantity of trapped charge (electrons) on the floating gate will cause the effective threshold voltage ($V_{th}$) of the field effect transistor comprising the source region, drain region, channel region and control gate to increase. If this increase is sufficiently large, the field effect transistor will remain in a nonconductive "off" state when a predetermined "read" voltage is applied to the control gate during a read operation (i.e., $V_{th} > V_{read}$).

In this state, known as the programmed state, the EEPROM device may be said to be storing a logic 0. Once programmed, the EEPROM device retains its higher threshold voltage even when its power supply is interrupted or turned off for long periods of time.

Reading of an EEPROM device is typically achieved by applying a predetermined read voltage ($V_{read}$) to the control gate, typically via a word line connecting a row of identical EEPROM devices or "cells", and applying a positive bias to the drain region, typically via a bit line connecting a column of identical EEPROM cells. If the EEPROM device is programmed, it will not conduct drain current ($I_{ds}$). However, if the EEPROM device has not been programmed (or has been erased), it will heavily conduct. In this state, the EEPROM device may be said to be storing a logic 1. Thus, by monitoring the bit line current, the programmed state (i.e., 1 or 0) of the EEPROM device can be determined.

As will be understood by those skilled in the art, a flash EEPROM integrated circuit memory device may contain a column-by-column array of NAND EEPROM cells having the general construction illustrated in cross-section and schematically by FIGS. 11.58 and 11.59 from a handbook by B. Prince et al. entitled *Semiconductor Memories*, John Wiley & Sons Ltd., pp. 603–604 (1991); and in an article by M. Momodomi et al. entitled *An Experimental 4-Mbit CMOS EEPROM with an NAND Structured Cell*, IEEE Journal of Solid State Circuits, Vol. 24, No. 5, p. 1238 October (1989). The operation of NAND EEPROM cells is also more fully described in commonly assigned U.S. Pat. No. 5,473,563 to Suh et al. entitled Nonvolatile Semiconductor Memory, the disclosure of which is hereby incorporated herein by reference.

To improve the operating speed of flash EEPROM integrated circuit memory devices which contain column-by-column arrays of NAND cells, data stored in memory cells connected to a common selected word line (i.e., a page of cells) are typically simultaneously read through a plurality of bit lines. This type of read operation is generally referred to as a page read operation and the data read from the plurality of bit lines is typically stored temporarily in respective data latches within a page buffer. This type of reading operation is more fully described in commonly assigned Korean Application No. 94-18870, published Aug. 19, 1994, the disclosure of which is hereby incorporated herein by reference. For example, FIG. 1 is a diagram illustrating the timing of signals needed to execute a single page read operation in a prior art integrated circuit memory device. In particular, FIG. 1 illustrates four time intervals which begin respectively a times $t_0$, $t_1$, $t_2$ and $t_3$. In the first time interval $t_0 \rightarrow t_1$, a page read operation is enabled by switching a latch enable signal CLEx from 0→1, maintaining an external address latch enable signal ALEx at a logic 0 level and toggling an external write enable signal $\overline{WEx}$ from 1→0. Then, during the second time interval $t_1 \rightarrow t_2$, address signals are applied upon switching of the address latch enable signal ALEx from 0→1. A page of memory cells are then read and stored in a page buffer during the third time interval $t_2 \rightarrow t_3$ when a read signal R/B is maintained at a logic 0 level. The buffer data read from an entire page of memory is then serially transmitted to external the memory device (via an I/O data path) during a fourth time interval beginning at time $t_3$. As illustrated by FIG. 1, the buffer data is serially transmitted in a synchronous manner in response to toggling of the read enable signal $\overline{REx}$. These operations are also described by FIG. 2 which functionally illustrates the transfer of a single page P1 of memory to an I/O data bus.

FIGS. 3–4 are diagrams illustrating the timing of signals needed to execute multiple page read operations in a prior art integrated circuit memory device and the transfer of multiple pages P1, P2, . . . Pn of memory to an I/O data bus, respectively. Here, the operations performed during the time periods $t_0 \rightarrow t_3$ are the same as those described above with respect to FIG. 1, however, during the time interval between time $t_4$ (at then end of the serial transmission of a page of data) and time $t_5$, a stand-by state occurs which interrupts the serial transmission of data from the memory device. This stand-by state occurs because during the time interval $t_4 \rightarrow t_5$, a new page of data to be serially transmitted is being downloaded from memory into the page buffer. Only at time $t_5$ can serial transmission of this new page of data be commenced. The stand-by state illustrated during the time interval $t_6 \rightarrow t_7$ is also caused by the fact that the next page of data to be serially transmitted must be first downloaded from memory into the page buffer.

Unfortunately, the occurrence of these stand-by states or holding periods reduces the efficiency of those memory read operations which require serial transfer of multiple pages of memory data. Thus, notwithstanding the above described conventional integrated circuit memory devices, there continues to be a need for memory devices having efficient read capability.

SUMMARY OF THE INVENTION

It is therefore an object of the present invention to provide improved integrated circuit memory devices and methods of operating same.

It is another object of the present invention to provide integrated circuit memory devices having efficient read capability, and methods of operating same.

These and other objects, features and advantages of the present invention are provided by integrated circuit memory devices having read controllers and subpage data buffers therein for performing interleaved read operations. These operations are performed to download respective subpages of memory while simultaneously serially transmitting previously downloaded subpages of memory so that consecutive pages of memory data can be serially transmitted as a continuous string of data without the occurrence of breaks therebetween caused by stand-by holding periods.

Memory devices according to the present invention typically contain an array of memory cells arranged as a plurality of pages (e.g., rows) of predetermined width coupled to a respective plurality of word lines and a plurality of columns of memory cells electrically coupled to a respective plurality of bit lines. In addition, first and second subpage buffers are preferably provided for temporarily storing subpages of data read from a plurality of addressed subpages of memory cells. Read controller means is also provided for initiating transfer of a previously read subpage of data from one of the first or second subpage buffers to an I/O data buffer, while simultaneously initiating an interleaved page read operation to read data from a subpage of addressed memory cells into the other of the first or second subpage buffers. The interleaved page read operation is preferably performed to prevent the occurrence of breaks in the transfer of data to the I/O data buffer when multiple pages of data are being downloaded and serially transmitted to external the memory device.

The above objects, features and advantages of the present invention are also provided by methods of transferring data from the memory cells to external the memory device by sequentially reading data from memory cells in a first page (at a first address) into at least first and second subpage buffers, transmitting data from the first subpage buffer to external the memory device and then transmitting from the second subpage buffer to external the memory device while simultaneously reading data from memory cells in a first subpage of a second page (at a second address) into the first subpage buffer. These steps are then followed by the step of transmitting data from the first subpage buffer to external the memory device while simultaneously reading data from memory cells in a second subpage of the second page into the second subpage buffer, so that once all the data from the first subpage buffer has been serially transmitted, the read data from the second subpage of the second page can be serially transmitted without interruption to preserve the integrity of the string of data being read from the memory device.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numbers refer to like elements throughout. Further, in the following description, specific details such as the number of memory cells, the number of NAND cells, the number of bit lines, the values of voltages, circuit elements and parts and so on are set forth to provide a more thorough understanding of the present invention. However, the present invention is not limited to these specific details.

Figure 1:
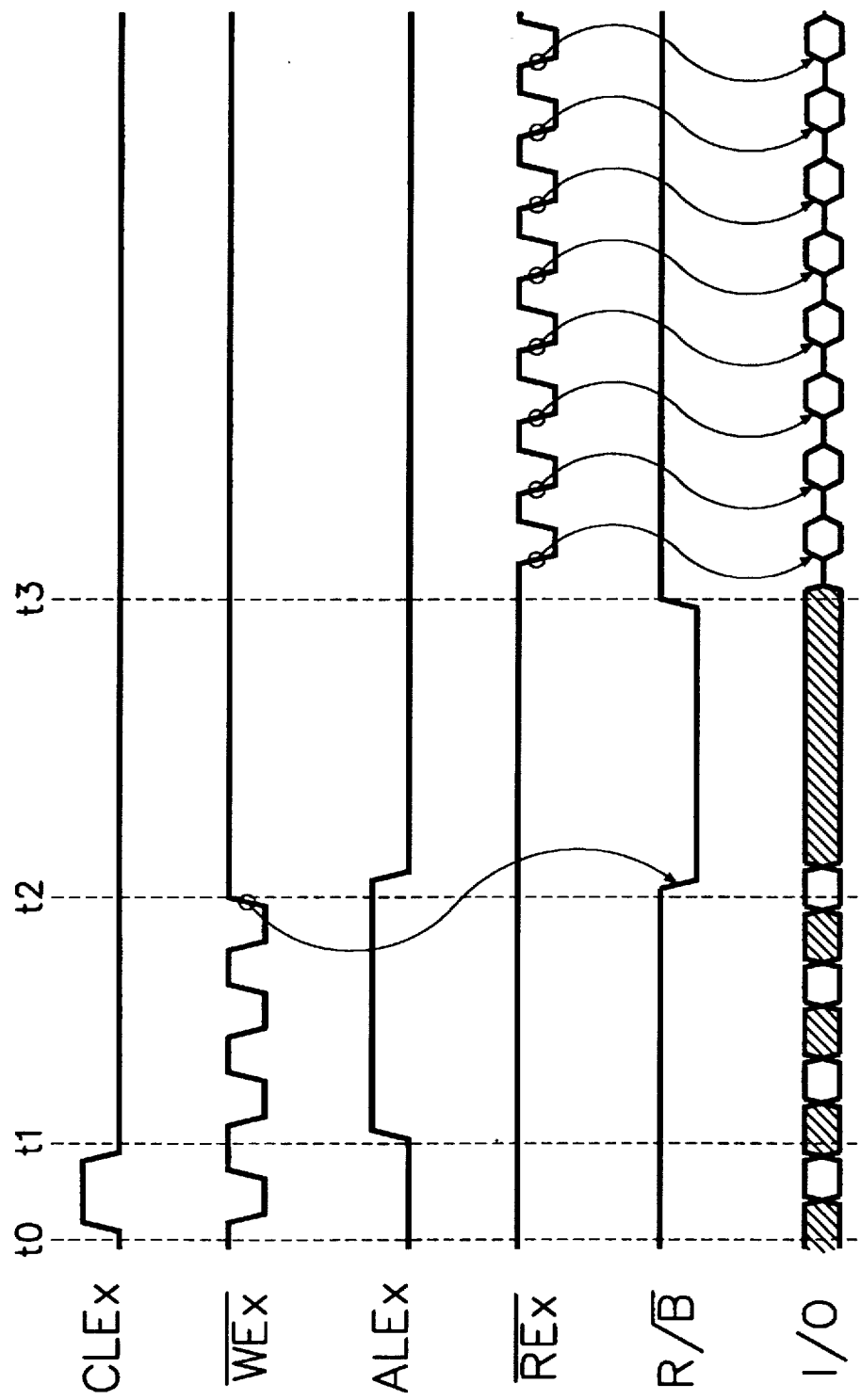
FIG. 1 is a diagram illustrating the timing of signals needed to execute a single page read operation in a prior art integrated circuit memory device.
Figure 2:
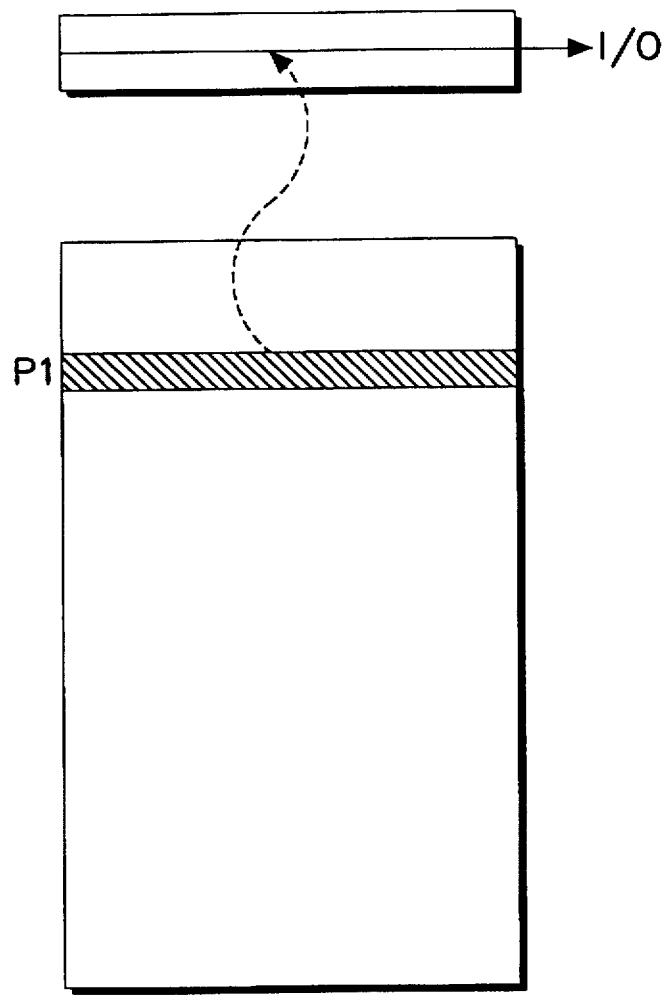
FIG. 2 is a diagram which functionally illustrates a transfer of a single page P1 of memory to an I/O data bus, according to the prior art.
Figure 3:
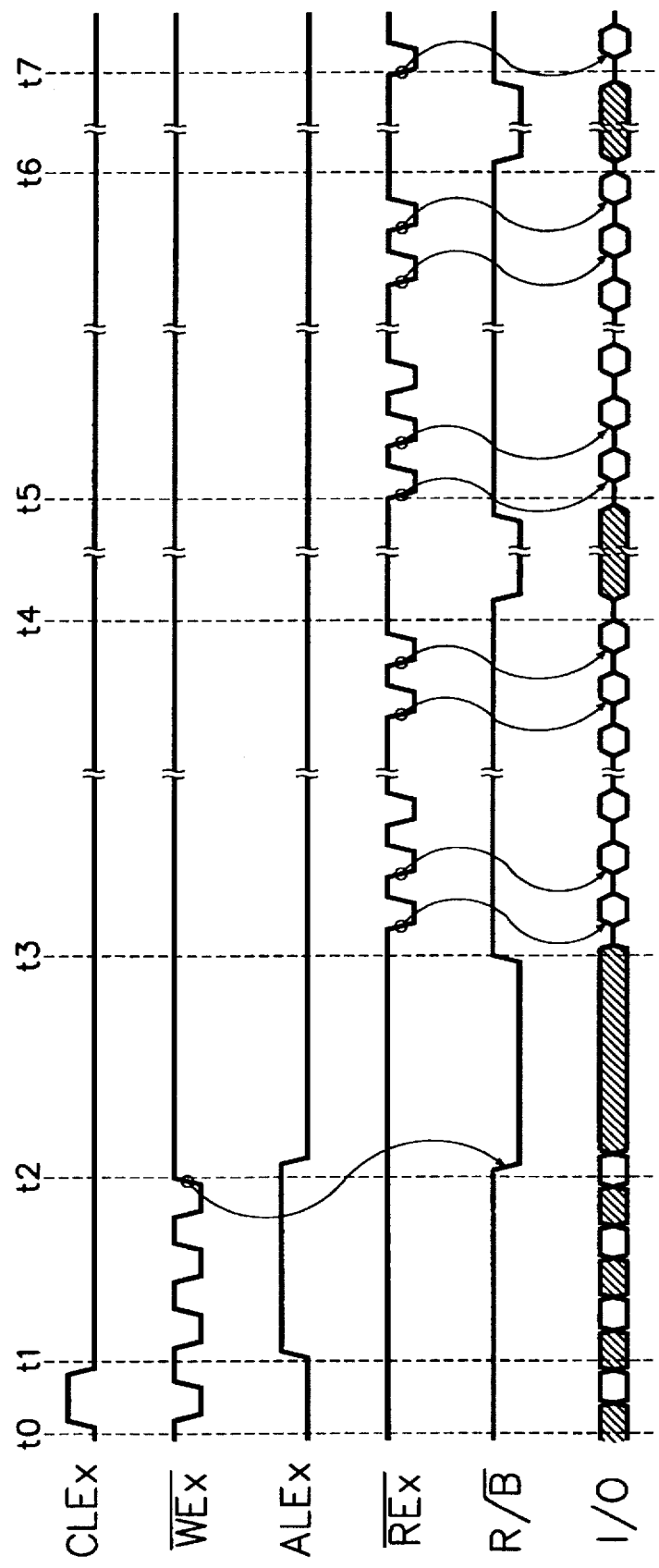
FIG. 3 is a diagram illustrating the timing of signals needed to execute multiple page read operations in a prior art integrated circuit memory device.
Figure 4:
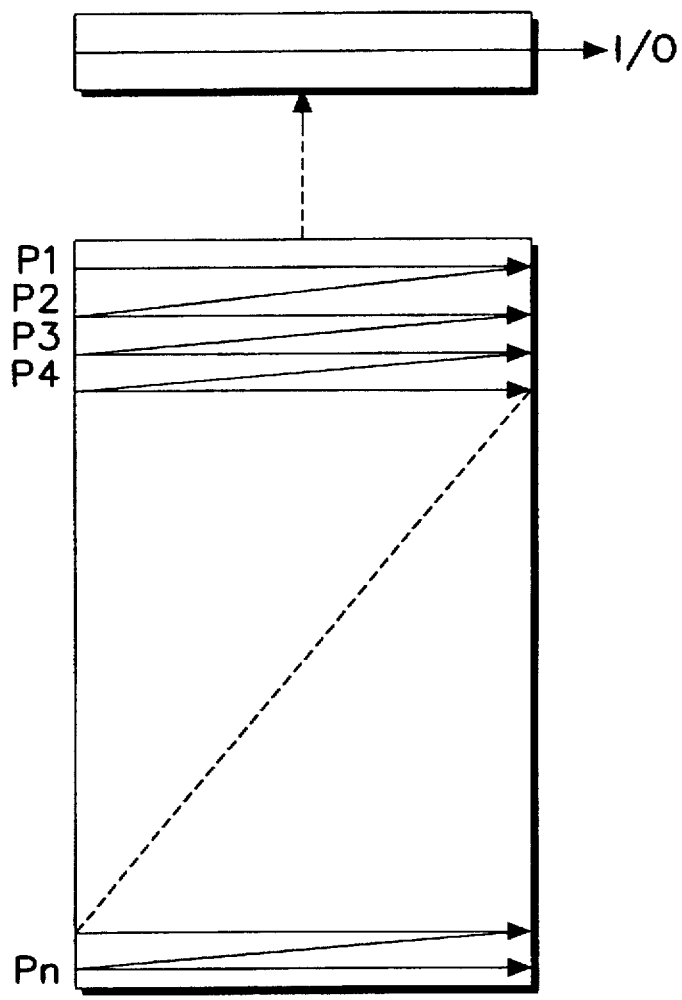
FIG. 4 is a diagram which functionally illustrates a transfer of multiple pages P1, P2, . . . Pn of memory to an I/O data bus, according to the prior art.
Figure 5:
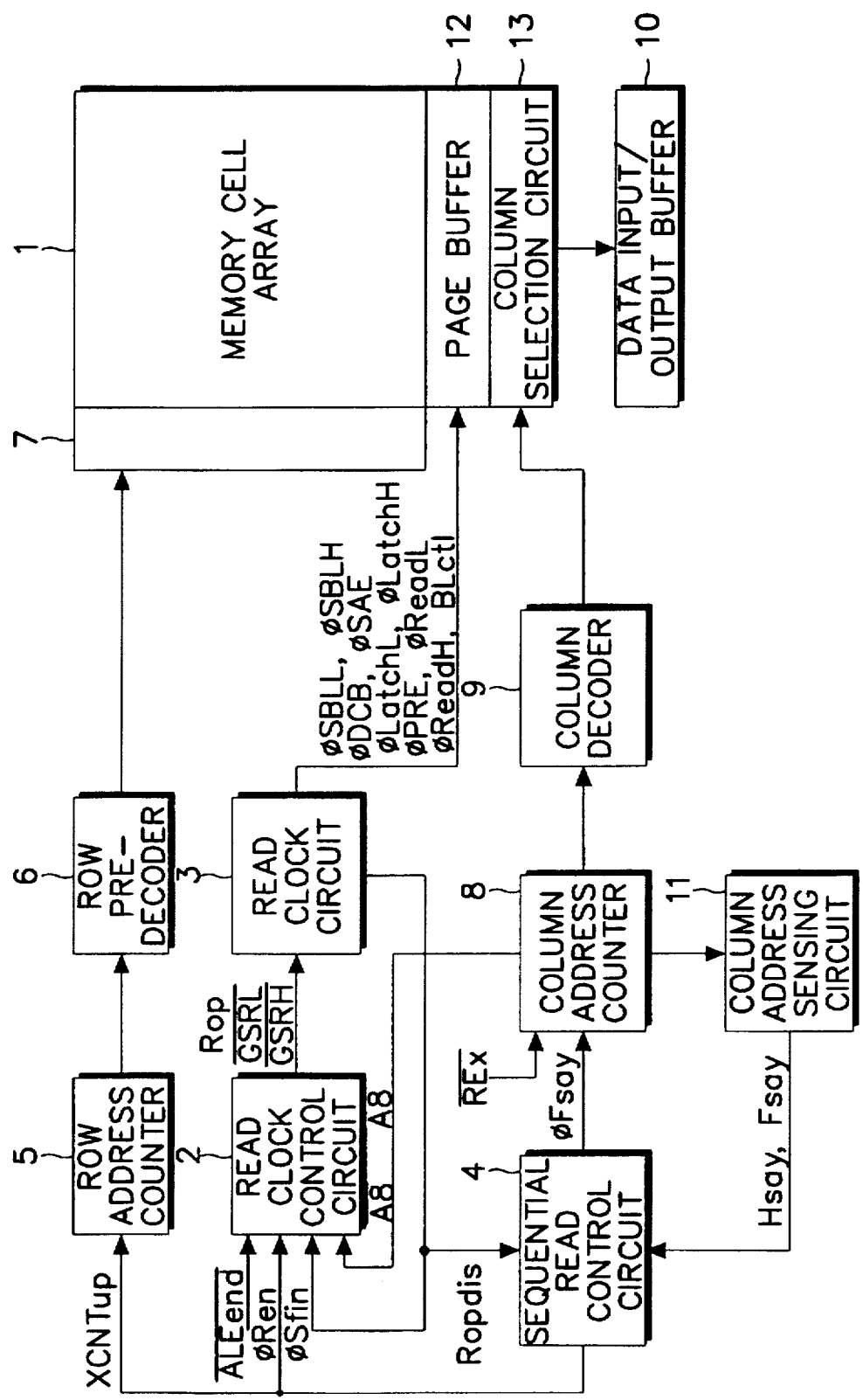
FIG. 5 is a block diagram which schematically illustrates a circuit for performing memory read operations according to an embodiment of the present invention.

Referring now to FIG. 5, an embodiment of an integrated circuit memory device according to the present invention will now be described. As illustrated, the memory device preferably contains a row address counter circuit 5 for performing a count-up operation in response a row address signal from an address buffer (not shown) and an external count-up signal XCNTup from a clock generating circuit (not shown) during the sequential read operation; a row predecoder 6 for generating a signal which controls a row decoder 7 in response to an output of the row address counter circuit 5; a column address counter 8 and a column decoder 9, both of which control output of sequential data in response to an external read enable signal $\overline{REx}$; a sequential read control circuit 4 for operating the sequential read operation; a read clock circuit 3 and a read clock control signal generating circuit 2, both of which perform the page read operation; a data input/output buffer 10 for inputting/outputting the data in serial format; a column address sensing circuit 11 for sensing an output signal of the column address counter 8 and for generating a signal to enable sequential page read operations; a memory cell array 1 arranged in a matrix configuration of rows (or pages) and columns; the row decoder 7 and a page buffer 12 electrically coupled to the memory cell array 1; and a column selection circuit 13 for performing a column selection operation. The construction and operation of the row address counter circuit 5 is more fully described in Korean Patent Application No. 94-25243, filed Oct. 1, 1994, the disclosure of which is hereby incorporated herein by reference.

Figure 6:
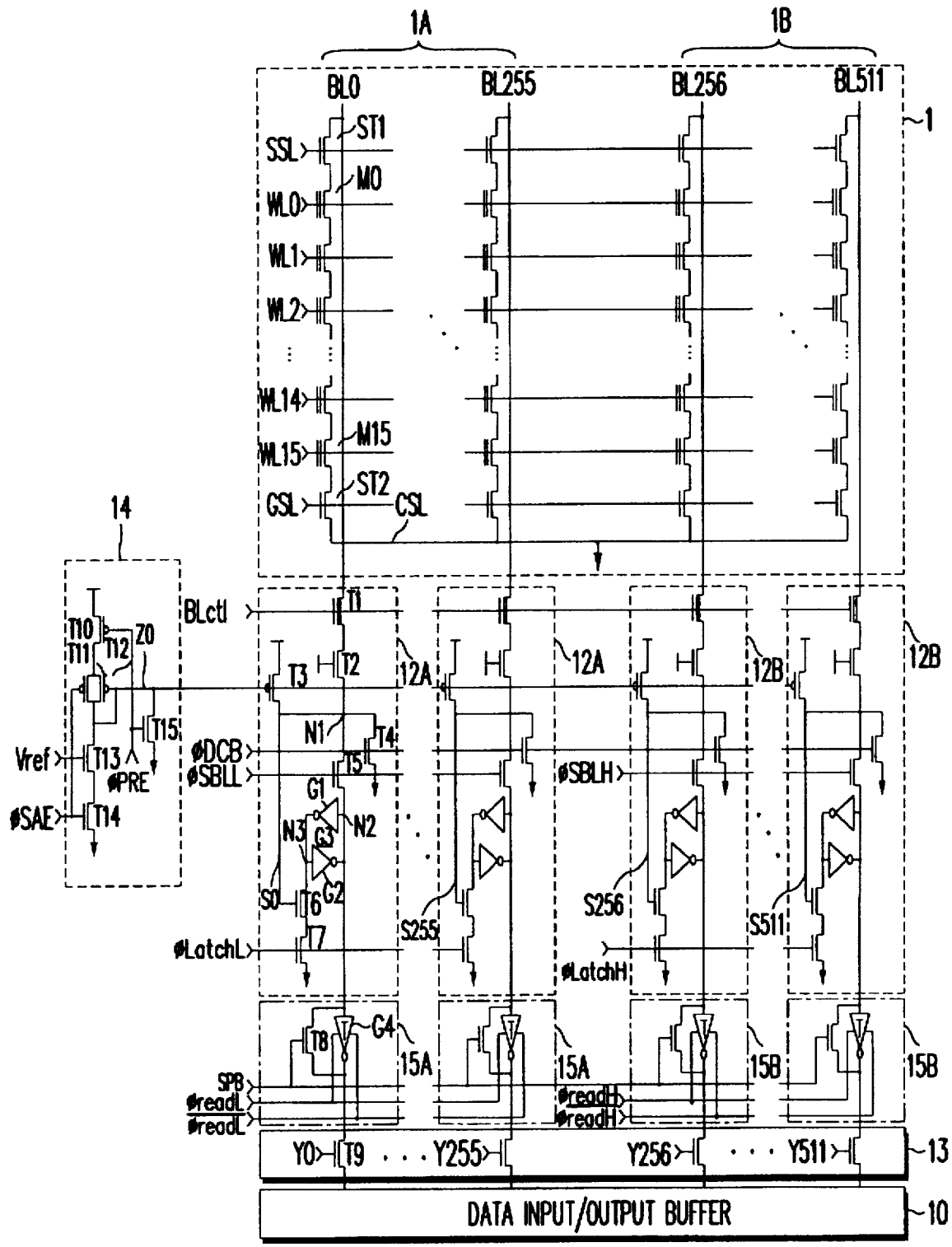
FIG. 6 is a detailed electrical schematic illustrating memory cell arrays, subpage buffers, path units, a column selection circuit and an I/O data buffer according to an embodiment of the present invention.

Referring now to FIG. 6, the memory cell array 1, the page buffer 12, the column selection circuit 13 and the data input/output buffer 10 illustrated in FIG. 5 will be more fully described. In particular, the page buffer 12 contains lower and upper page buffer cells 12A and 12B, respectively, connected with each of the bit lines BL0–BL511 in the memory cell array 1. Among other things, the page buffer cells 12A and 12B perform a sense amplifying function for reading data from the memory cell array 1 and a function for temporarily storing the read data. A current supply circuit 14 is also provided. The current supply circuit 14 is connected to one side of the page buffer 12 and contains a current mirror which adjusts the amount of the current supplied to a bit line BL when reading data from the memory cell array. Upper and lower input/output path units 15A and 15B are also provided and connected to an output terminal of the page buffer 12, for receiving an external control signal for controlling inputting and outputting of the data. A column selection circuit 13 composed of column selection transistors (i.e., pass transistors) is also connected to the output terminals of the input/output path units 15A and 15B. A data input/output buffer 10 is also connected to each of the column pass transistors. The data input/output buffer 10 provides a data bus and data input/output I/O terminals with data in response to latch enable signals or data output enable signals, and converts externally supplied data (inputted through the data input/output I/O terminals) into CMOS compatible levels and latches the converted data.

As illustrated, the lower sub memory cell 1A may contain 256 NAND cell units. However, different numbers of cell units may also be provided depending on the desired size of the memory cell array 1. As illustrated, each NAND cell unit in FIG. 6 contains 16 EEPROM memory transistors M0–M15 having channels connected in series between a source of a first selection transistor ST1 and a drain of a second selection transistor ST2. A drain of the first selection transistor ST1 in each NAND cell unit is connected to a corresponding bit line BL through a resistance connection. A source of the second selection transistor ST2 of each NAND cell unit is connected to a common source line CSL. The control gates of the first selection transistors ST1, the control gates of the memory cells M1–M16 and the control gates of the second selection transistors ST2 are arranged in respective rows and are connected with a first selection line SSL, word lines WL0–WL15 and a second selection line GSL, respectively, as will be understood by one skilled in the art. As will be understood by those skilled in the art, each of the first selection line SSL, the word lines WL0–WL15 and the second selection line GSL are connected to the row decoder 7. The upper sub memory cell array 1B also preferably has the same construction as that of the lower sub memory cell array 1A. The construction and layout of the NAND cell units contained in the memory cell array 1 are more fully described in Korean Patent Application No. 94-18870, the disclosure of which is hereby incorporated herein by reference.

In the page buffer 12 connected with the bit line BL, as illustrated in FIG. 6, a drain of the D type (depletion-mode) transistor T1 (for preventing transmission of a high voltage on the bit line BL) is connected with the bit line BL and a bit line control signal BLct1 is applied to a gate of the D type transistor T1. A source of the D type transistor T1 is connected with a drain of the N type transistor T2 for setting a precharge level on the above bit line BL during the read operation, and the power supply voltage Vcc is applied to a gate of the N type transistor T2. Thus, a source of the N type transistor T2 senses and latches the data stored at the selected memory transistors.

Further, the page buffer 12 is composed of the D type transistor T1; the N type transistor T2; an N type transistor T5 (which has a drain-source path connected between nodes N1 and N2); an N type transistor T4 (where the drain-source path thereof is connected between the node N1 and a ground voltage Vss); inverters G1 and G2 crossly connected with each other between nodes N2 and N3; N type transistors T6 and T7 (having drain-source paths connected in series with each other between the node N3 and the ground voltage Vss); and a P type transistor T3 having a drain-source path connected between a data sensing line S0 connected to a gate of the N type transistor T6 and the power supply voltage Vcc. As stated hereinabove, the inverters G1 and G2 which are crossly connected to each other between the nodes N2 and N3 constitute a data latch circuit G3. Also, the N type transistors T6 and T7 (connected in series with each other between the node N3 and the ground voltage Vss) and the above data sensing line S0 compose the data sensing circuit. A gate of the N type transistor T4 is connected with an initialization control signal φDCB and a gate of the N type transistor T5 is connected with a lower isolation control signal φSBLL. Here, the gate of the N type transistor T5 isolates the nodes N1 and N2 from each other in response to the above lower isolation control signal φSBLL. A gate of the N type transistor T7 is connected with a lower buffer latch signal φLatchL. The N type transistors T4 and T5 initialize the node N3 as the logic "high" level in response to the above initialization control signal φDCB and the above lower isolation control signal φSBLL.

The current supply circuit 14 (constructed in a current mirror format relative to the P type transistor T3) provides the precharge current for precharging the bit line BL and the data sensing line S0 and a sensing current for sensing the data stored at the memory transistor connected with the bit line BL. Furthermore, in the above current supply circuit 14, the source-drain path of a P type transistor T10 between the power supply voltage Vcc and the ground voltage Vss, the source-drain paths of the P type transistors T11 and T12 connected in parallel with each other, and the drain-source paths of the N type transistors T13 and T14 are connected in series with one another. The gates of the P type transistors T3 and T12 are connected to each other through a line Z0, and the drain-source path of an N type transistor T15 is connected between the line Z0 and the ground voltage Vss. The gates of the N type transistor T5 and the P type transistor T10 are coupled to a precharge control signal φPRE. The gate of the P type transistor T12 is commonly connected with a drain thereof and the gate of the N type transistor T13 is connected to a reference voltage Vref. A sense amplification enable signal φSAE is applied to a gate of the N type transistor T14. The N type transistor T14 pulls down the line Z0 to the ground voltage Vss in response to the precharge control signal φPRE, and thus the P type transistor T3 goes to the on-state. The bit line BL is precharged due to the on-state of the P type transistor T3. Here, the P type transistor T3 fully holds at the on-state enough to precharge the bit line BL rapidly. Hereafter, the line Z0 goes to the predetermined voltage level in response to the sense amplification enable signal φSAE, and thus the P type transistor T3 turns on slightly to thereby supply the infinitesimal current (Isense) to the data sensing line S0.

The data stored at the data latch circuit G3 (composed of the inverters G1 and G2) is applied to a drain of the column selection transistor T9 in the column selection circuit 13 via a tri-state inverter G4 responding to a lower read control signal φReadL. The drain-source path of the N type transistor T8 is also connected in series between the input/output terminals of the tri-state inverter G4 and a gate thereof is connected with a control signal SPB. The above description of FIG. 6 with respect to the page buffer 12, the input/output path unit 15, and the column selection circuit 13 which are connected to the bit line BL0 is the same for those circuits corresponding to bit lines BL1–BL511. In addition, in the upper page buffer 12B and the upper input/output path unit 15B, the N type transistor T5 is responsive to upper isolation control signal φSBLH, the N type transistor T7 is responsive to the upper buffer latch signal φLatchH, and a tri-state inverter G4 is responsive to the upper read control signal φReadH.

Figure 7:
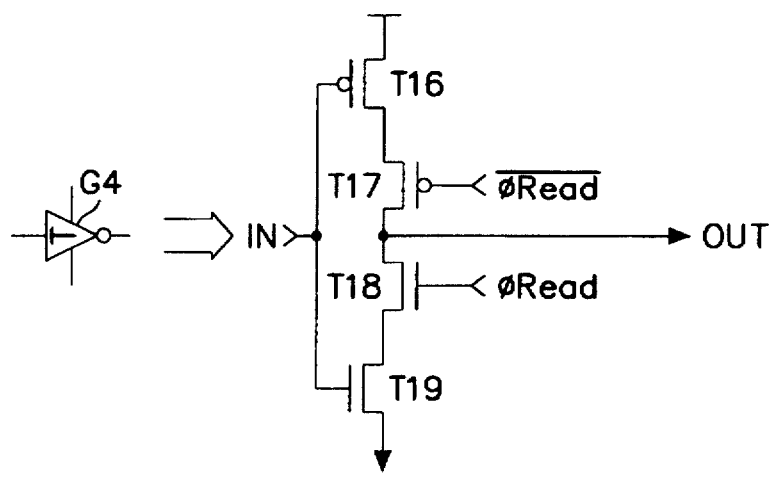
FIG. 7 is an electrical schematic of a tri-state inverter illustrated in FIG. 6.

FIG. 7 is a detailed circuit diagram illustrating the tri-state inverter G4 used in FIG. 6. In FIG. 7, the tri-state inverter G4 includes P type transistors T16 and T17 and N type transistors T18 and T19. Complementary read control signal φRead and a read control signal φRead are respectively connected with a gate of the P type transistor T17 and a gate of the N type transistor T18.

Figure 8:
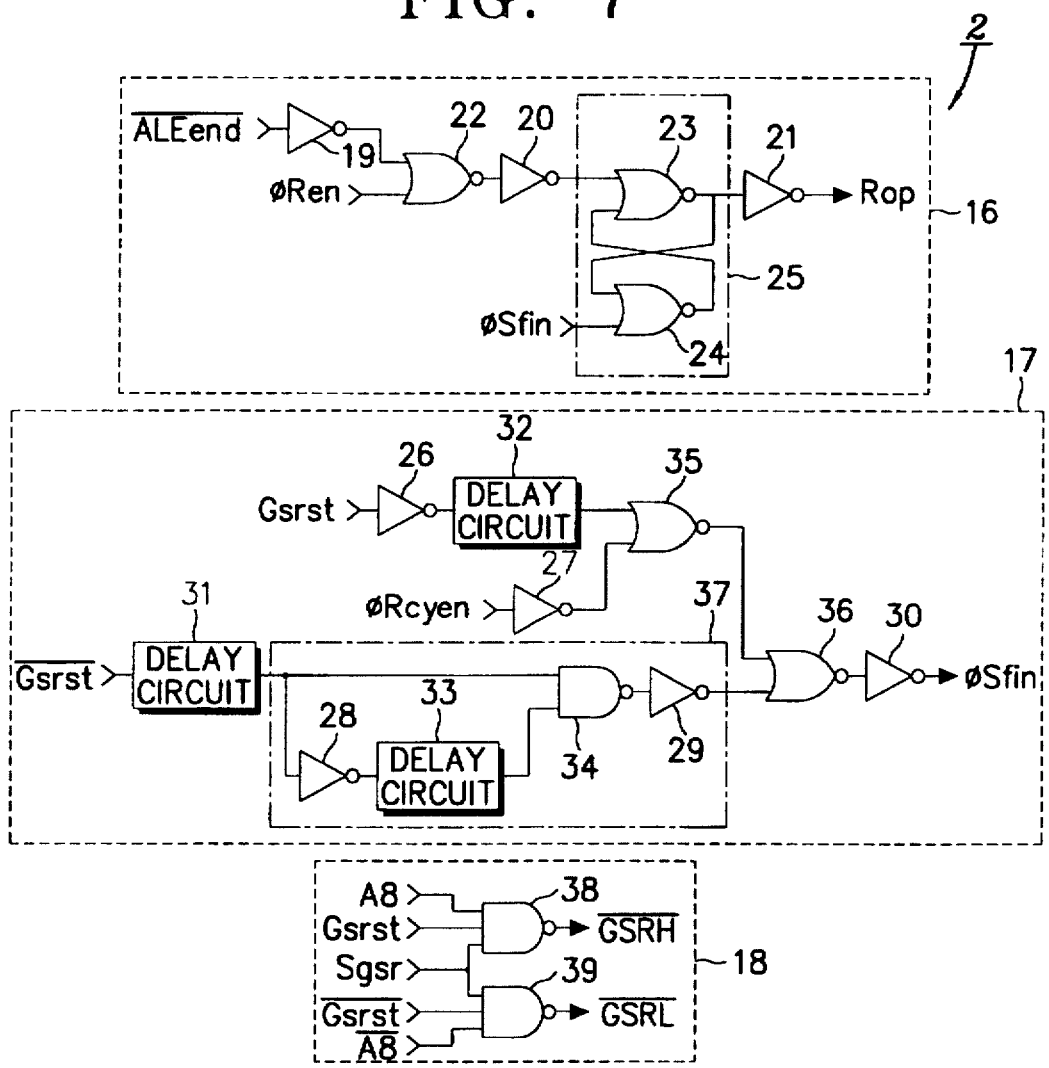
FIG. 8 is an electrical schematic illustrating a read clock control signal generating circuit for generating control signals illustrated by FIG. 6.

FIG. 8 is a detailed block diagram illustrating a read clock control signal generating circuit 2 for generating various control signals used by the circuit of FIG. 6. With regard to FIG. 8, the read clock control signal generating circuit 2 is composed of a read operation control signal generating circuit 16 which indicates that the page read operation is under performance, a read completion signal generating circuit 17 which indicates the completion of the page read operation, and a buffer control signal generating circuit 18 for generating signals which control the connected page buffer 12.

As illustrated by FIG. 8, the read operation control signal generating circuit 16 is comprised of inverters 19–21 and NOR gates 22–24. The NOR gates 23 and 24 are crossly connected to each other in order to form a flip flop 25. The read operation control signal generating circuit 16 generates a read operation signal Rop which goes from the logic "low" level to the logic "high" level in response to the transition of the logic "low" level of an address latch completion signal ALE end and to the combination of the logic "high" level of a page read enable signal φRen. The read operation control signal Rop goes from the logic "high" level to the logic "low" level, and is disabled in response to the transition of the logic "high" level of a read completion control signal φSfin.

The read completion signal generating circuit 17 as shown in FIG. 8 generates the read completion control signal φSfin in response to a count signal Gsrst, a driving signal φRcyen and a complementary count signal $\overline{Gsrst}$. The read completion signal generating circuit 17 includes inverters 26–30, delay circuits 31–33, an NAND gate 34, and NOR gates 35 and 36. A pulse generating circuit 37 composed of the inverters 28 and 29, the delay circuit 33 and the NAND gate 34 detects the transition of the logic "high" level of the complementary count signal $\overline{Gsrst}$ (representing that the page read operation is completely performed more than once) and then generates a short pulse of the logic "high" level. Namely, in the pulse generating circuit 37, the read completion control signal φSfin (which is indicative of the completion of the read operation) is generated as a short pulse which goes from the logic "low" level to the logic "high" level. This is in response to a short pulse of the logic "high" level generated from the NOR gate 35 by means of the transition of the logic "high" level of the count signal Gsrst and of the clock of the logic "high" level of the short width of the driving signal φRcyen and to the short pulse of the logic "low" level generated from the pulse generating circuit 37.

The buffer control signal generating circuit 18 as shown in FIG. 8 generates lower and upper buffer control signals $\overline{GSRL}$ and $\overline{GSRH}$ which control the page buffer 12 in response to an address signal A8, a complementary address signal $\overline{A8}$, the counter signal Gsrst, the complementary counter signal $\overline{Gsrst}$ and a flag signal Sgsr indicative of the read mode.

Figure 9:
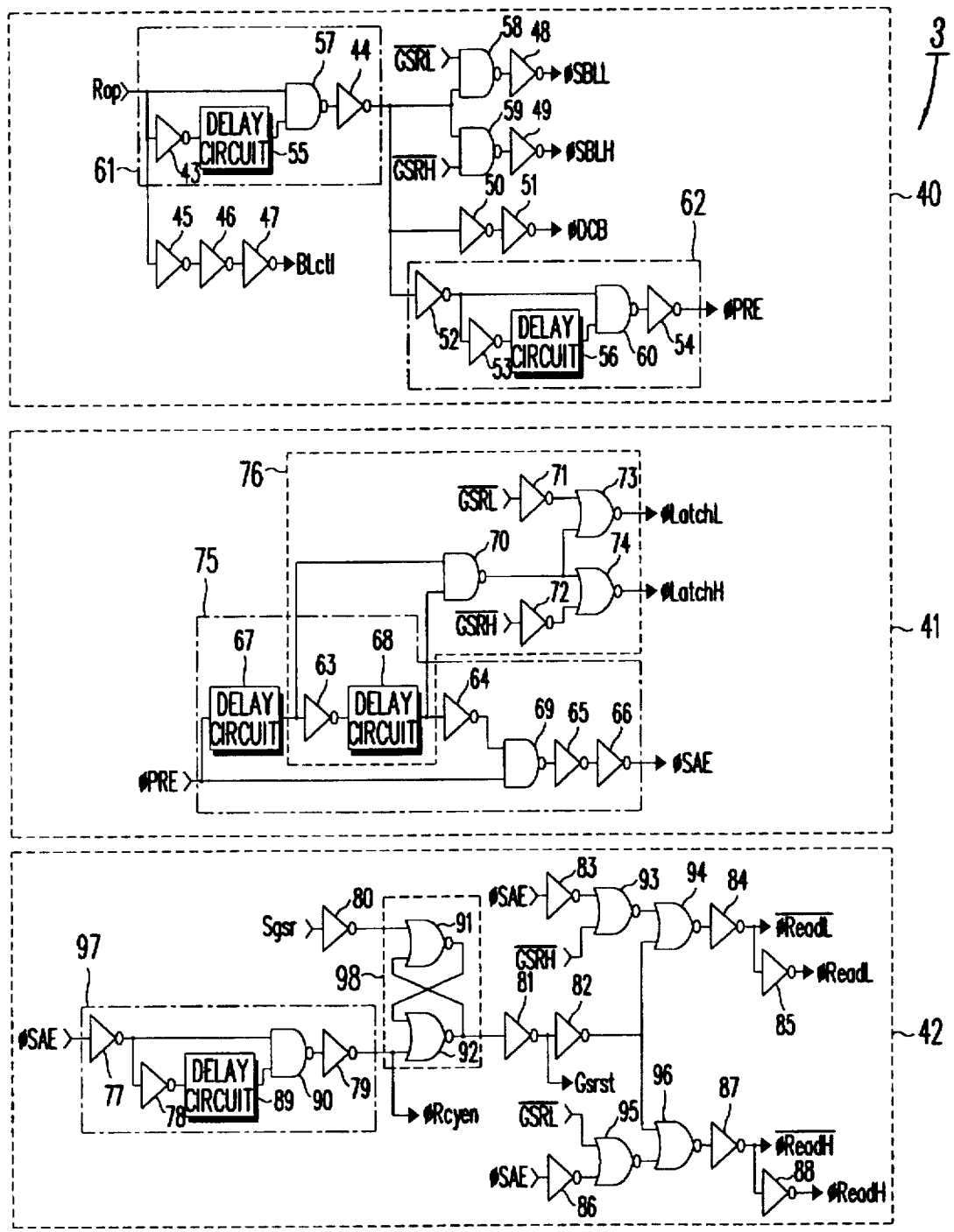
FIG. 9 is an electrical schematic illustrating a read clock circuit for generating control signals illustrated by FIG. 6.

FIG. 9 is a detailed block diagram illustrating a read clock circuit 3 for generating various control signals used in FIG. 6. In particular, the read clock circuit 3 is constructed with a control signal generating circuit 40, a sensing and latch control signal generating circuit 41 and a read control signal generating circuit 42. Also, the control signal generating circuit 40 of the read clock circuit 3 is constructed with inverters 43–54, delay circuits 55 and 56, and NAND gates 57 and 60. The control signal generating circuit 40 generates the lower and upper isolation control signals φSBLL and φSBLH, a bit line control signal BLct1, the initialization control signal φDCB and the precharge control signal φPRE in response to the read operation signal Rop from the read operation control signal generating circuit 16 and to the lower and upper buffer control signals $\overline{GSRL}$ and $\overline{GSRH}$. A first clock generating circuit 61 composed of the inverters 43 and 44, the delay circuit 55 and the NAND gate 57, generates the clock of the logic "high" level designated by the time delay of the delay circuit 55 in response to the transition of the logic "high" level of the read operation signal Rop. The NAND gates 58 and 59 and the inverters 48 and 49, respectively, output the lower and upper isolation control signals φSBLL and φSBLH in response to the clock of the logic "high" level from the first clock generating circuit 61 and to the lower and upper buffer control signals $\overline{GSRL}$ and $\overline{GSRH}$. The inverters 50 and 51 output the initialization control signal φDCB as the clock of the logic "high" level in response to the clock of the logic "high" level from the first clock generating circuit 61. A second clock generating circuit 62 composed of the inverters 52–54, the delay circuit 56, and the NAND gate 60 generates the clock of the logic "high" level determined by the time delay of the delay circuit 56 in response to the transition of the logic "low" level of the clock from the first clock generating circuit 61, that is, the precharge control signal φPRE. The inverters 46 and 47 output the clock of the logic "low" level, that is, the bit line control signal BLct1, in response to the read operation signal Rop.

The sensing and latch control signal generating circuit 41 as shown in FIG. 9 generates the sense amplification enable signal φSAE and the lower and upper latch control signals φLatchL and φLatchH in response to the precharge control signal φPRE and the lower and upper buffer control signals $\overline{GSRL}$ and $\overline{GSRH}$. A sensing control signal generating circuit 75 constituted with inverters 63–66, delay circuits 67 and 68 and an NAND gate 69, generates the clock of the logic "high" level of the pulse width determined by the sum of the delay times of the delay circuits 67 and 68. A latch control signal generating circuit 76 composed of inverters 63, 71 and 72, a delay circuit 68, a NAND gate 70 and NOR gates 73 and 74, generates the clock of the pulse width determined by the delay time of the delay circuit 68, i.e., the lower and upper latch control signals φLatchL and φLatchH, in response to the precharge control signal φPRE through the delay circuit 67.

In response to the sense amplification enable signal φSAE from the sensing control signal generating circuit 75, the flag signal Sgsr, the driving signal φRcyen, and the lower and upper buffer control signals $\overline{GSRL}$ and $\overline{GSRH}$ from the sensing control signal generating circuit 75, the read control signal generating circuit 42 as illustrated in FIG. 9 generates a lower read control signal φReadL, a complementary lower read control signal $\overline{\phi ReadL}$, and an upper read control signal φReadH, and a complementary upper read control signal $\overline{\phi ReadH}$. The read control signal generating circuit 42 is included with inverters 77–88, a delay circuit 89, an NAND gate 90 and NOR gates 91 and 96. A third clock generating circuit 97 comprising the inverters 77–79, the delay circuit 89, and the NAND gate 90, generates the short pulse of the logic "high" level in response to the transition of the logic "low" level of the sense amplification enable signal φSAE and the generated short pulse is used as the above driving signal φRcyen. A flip flop 98 composed of NOR gates 91 and 92 generates a signal which goes from the logic "high" level to the logic "low" level in response to the short pulse of the logic "high" level from the third clock generating circuit 97, and accordingly, the count signal Gsrst is transitioned from the logic "low" level to the logic "high" level. When completing the sensing operations in the NOR gates 95 and 93 to which the count signal Gsrst, the sense amplification enable signal φSAE, the lower and upper buffer control signals $\overline{\phi GSRL}$ and $\overline{\phi GSRH}$ are respectively applied, (i.e., when the sense amplification enable signal φSAE goes to the logic "low" level) the flip flop 98 generates the lower read control signal φReadL, the complementary lower read control signal $\overline{\phi ReadL}$, and the upper read control signal φReadH, and the complementary upper read control signal φReadH.

Figure 10:
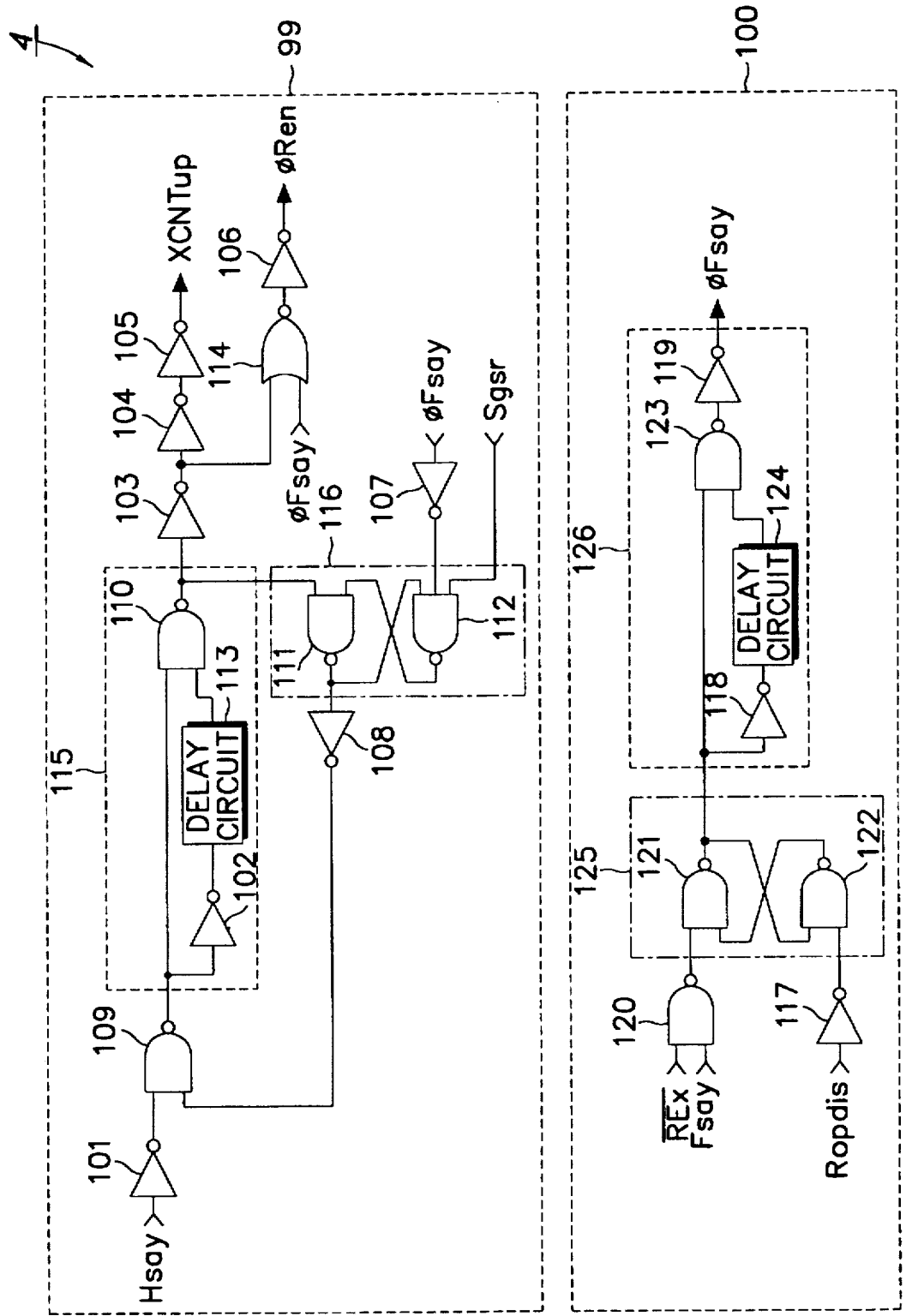
FIG. 10 is an electrical schematic illustrating a sequential read control circuit for generating control signals illustrated by FIG. 6.

FIG. 10 is a detailed block diagram illustrating a sequential read control circuit 4 for generating various control signals used in FIG. 6. In particular, the sequential read control circuit 4 is included with a count-up and page read signal generating circuit 99 and a column address reset signal generating circuit 100. The count-up and page read signal generating circuit 99 generates the external count-up signal XCNTup and the page read enable signal φRen in response to a column address sensing signal Hsay representing the completion of the read operation of the column address, a column start signal φFsay, and the flag signal Sgsr. The count-up and page read signal generating circuit 99 is composed of inverters 101–108, NAND gates 109–112, a delay circuit 113, and a NOR gate 114. A flip flop 116 comprising the NAND gates 111 and 112 generates a signal which is transitioned from the logic "low" level to the logic "high" level in response to the short pulse of the logic "high" level of the column start signal φFsay and to the logic "high" level of the flag signal Sgsr. A fourth clock generating circuit 115 having the inverter 102, the delay circuit 113, and the NAND gate 110 generates the short pulse of the logic "low" level in response to the transition of the column address sensing signal Hsay from the logic "low" level to the logic "high" level and the transition of the logic "high" level of the flip flop 116. Thus, due to the short pulse of the logic "low" level, there is generated the short pulse of the logic "high" level, i.e., the external count-up signal XCNTup via the inverters 103–105. The NOR gate 114 and the inverter 106 generate the short pulse of the logic "high" level (i.e., the page read enable signal φRen) in response to the transition of the logic "low" level from the fourth clock generating circuit 115 and the short pulse of the logic "high" level of the column start signal φFsay.

The column address reset signal generating circuit 100 of FIG. 10 generates the short pulse of the logic "high" level, i.e., the column start signal φFsay in response to the toggling of the external read enable signal $\overline{REx}$, the short pulse of the logic "high" level of the column completion signal Fsay, and a data transmission completion signal Ropdis of the logic "low" level. The column address reset signal generating circuit 100 is included with inverters 117–119, NAND gates 121 and 123 and a delay circuit 124. A flip flop 125 composed of the NAND gates 121 and 122 generates the short pulse of the logic "high" level in response to the external read enable signal $\overline{REx}$, the column completion signal Fsay, the column start signal φFsay and a fifth clock generating circuit 126 outputs the short pulse of the logic "high" level after receiving an application of the short pulse of the logic "high" level. Then, the fifth clock generating circuit 126 is included with the inverters 118 and 119, the delay circuit 124 and the NAND gate 123.

Figure 11A:
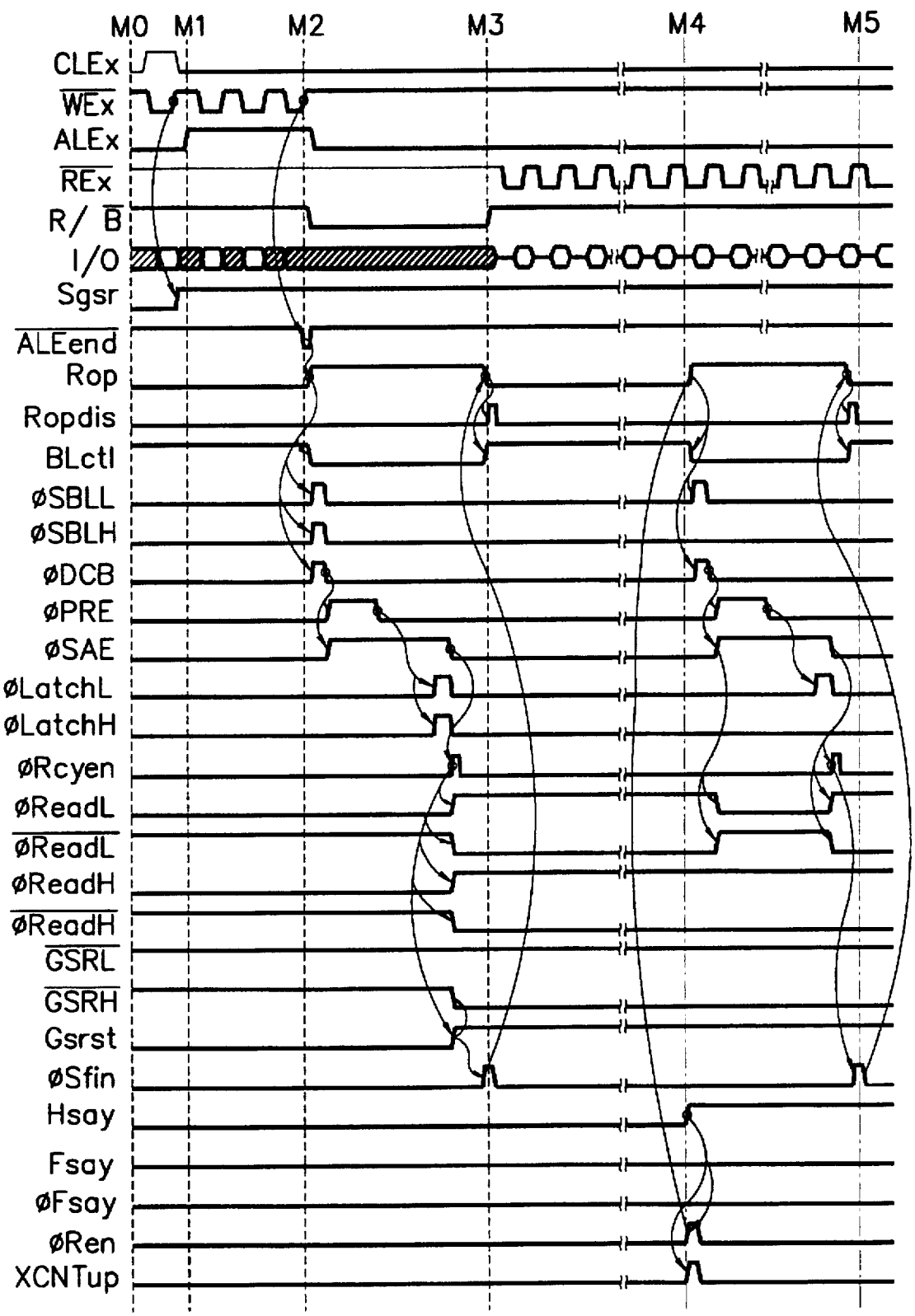
FIGS. 11A and 11B are diagrams illustrating the timing of signals needed to execute multiple subpage read operations according to the present invention.
Figure 11B:
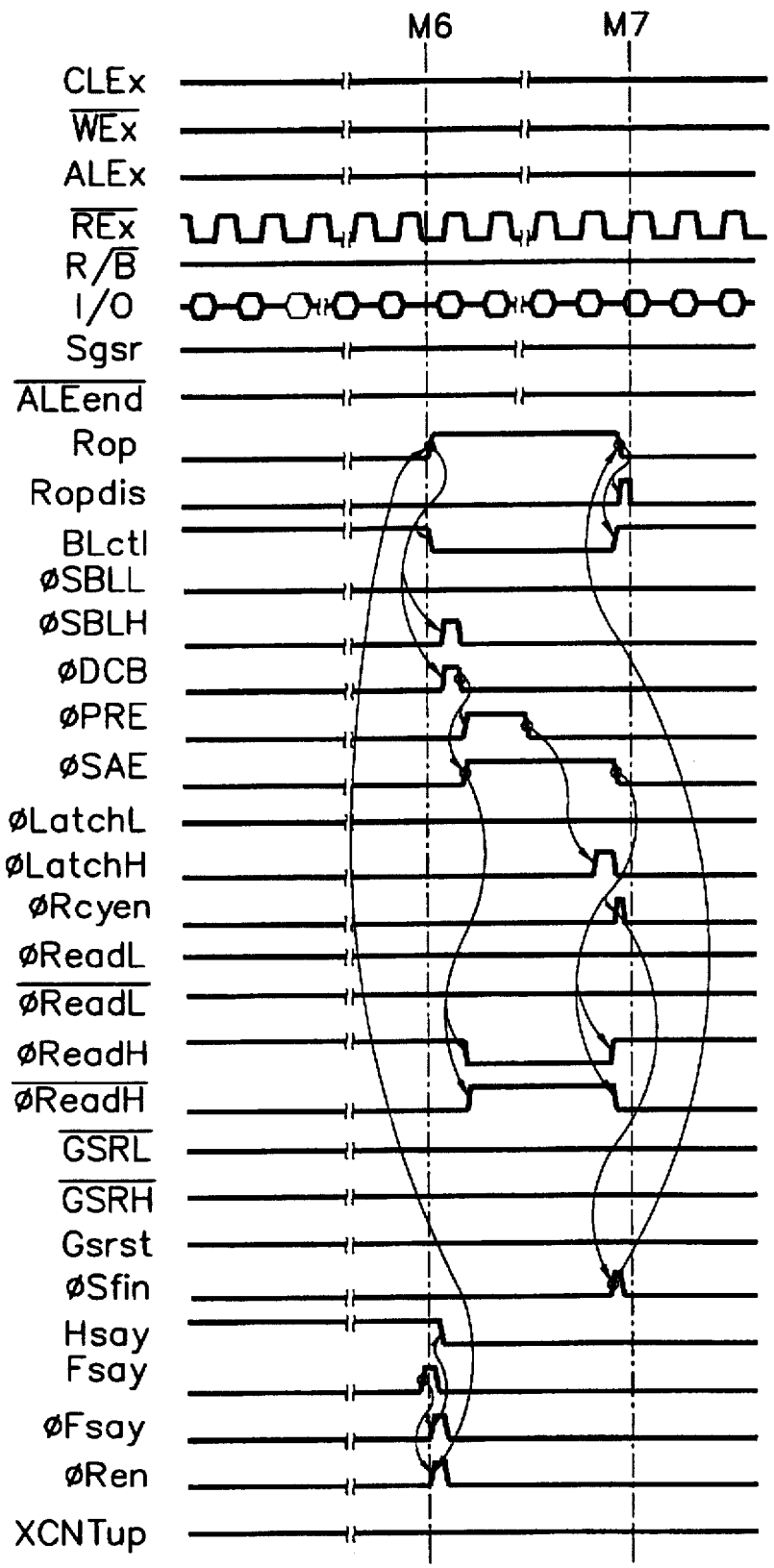

FIGS. 11A and 11B are timing diagrams illustrating the timing relations of various control signals used in FIG. 6. In particular, the read operation according to the present invention will now be explained in detail with reference to FIGS. 5 to 11. Firstly, as can be seen from FIGS. 11A and 11B, a time interval between time M0 and time M1 is indicated as a time interval to input a command for the read operation, and the flag signal Sgsr (indicative of the read operation mode from a command register (not shown) existing at an interior of the semiconductor memory device) is transitioned from the logic "low" level to the logic "high" level. Following that, a time interval between time M1 and time M2 is indicated as a time interval for inputting a column address and a row address. Thus, when a final address is inputted, the address latch completion signal $\overline{ALEend}$ for enabling the page read operation for the memory cell is toggled from the logic "high" level to the logic "low" level for a short time, so that the read operation signal Rop (indicating that the page read operation is under performance) can be transitioned from the logic "low" level to the logic "high" level. In this case, when the read operation signal Rop is transitioned from the logic "low" level to the logic "high" level the read operation is performed. Thus, the read operation for one page P1 is performed in the above time interval between time M2 and time M3.

Thereafter, in the time interval between time M2 and time M3 (when the bit line control signal BLct1 for maintaining the bit lines BL0–BL511 below the level of the shut off voltage of the D type transistor T1 is transitioned from the logic "high" level to the logic "low" level), the control signals for discharging the above bit lines and setting the page buffer 12 (for example, the lower isolation control signal φSBLL, the upper control signal φSBLH, and the initialization control signal φDCB) are enabled from the logic "low" level to the logic "high" level during a predetermined period. Thus, all of bit lines are discharged to the ground level through the N type transistors T4 and T5 of FIG. 6, and the lower and upper page buffers 12A and 12B of the page buffer 12 connected to each of the bit lines are set. At this moment, upon the page read operation, all of the upper buffer control signal $\overline{GSRH}$ and the lower buffer control signal $\overline{GSRL}$ for respectively enabling the lower page buffer 12A (connected to the bit lines BL0–BL255 selected by the address for selection of the lower sub memory cell array 1A in the page buffer 12 constituting one page) and enabling the upper page buffer 12B (connected to the bit lines BL256–BL511 selected by the address for selection of the upper sub memory cell array 1B thereof) are maintained as the logic "high" level.

When the bit lines are discharged and one of the lower and upper page buffers 12A and 12B is completely set, the precharge control signal φPRE and the sense amplification enable signal φSAE are transitioned from the logic "low" level to the logic "high" level. Due to this, the voltage applied to the gate of the P type transistor T3 connected to the bit lines goes to the logic "low" level, and thereby much current is applied to each of the bit lines, so that all of the bit lines can be precharged to the shut off voltage level of the D type transistor T1 and the data sensing lines S0–S511 can stay at the level of the power supply voltage Vcc. As described above, after the bit lines are appropriately precharged, the precharge control signal φPRE is transitioned from the logic "high" level to the logic "low" level to thereby be disabled. Here, the voltage of the gate of the P type transistor T3 connected to all of bit lines can be increased from the logic "low" level to the predetermined voltage level, thereby supplying the infinitesimal current (Isense) to the above bit lines. In this instance, the reference voltage Vref applied to the gate of the N type transistor T13 located at an interior of the current supply circuit 14 is always maintained to the predetermined voltage level. Then, in the case that the current discharged to the ground level by the selected memory cell is more than the infinitesimal current (Isense) supplied to the bit lines according to the data of the selected memory cell connected to the bit lines, the bit lines precharged to the shut off voltage level are transitioned to the ground level. However, alternatively, in the case that the current discharged to the ground level by the selected memory cell is less than the infinitesimal current (Isense) supplied to the bit lines according to the data thereof, the bit lines precharged to the shut off voltage level go to the shut off voltage level, so that each of data sensing lines S0–S511 can become the level of the power supply voltage Vcc or the ground level depending on the data of the selected memory cell.

Once the voltage level of each data sensing line S0–S511 is determined depending on the data of the selected memory cell, the lower and upper buffer latch signals φLatchL and φLatchH for storing the read data in the page buffer 12 are enabled from the logic "low" level to the logic "high" level. At that point, since all of the N type transistors T6 and T7 are turned on, the page buffer 12 where the data sensing lines S0–S511 stay at the level of the power supply voltage Vcc (upon reading an off-cell), is inverted. Meantime, conversely, in the case that the data sensing lines S0–S511 stay at the ground level (upon reading an on-cell), since the N type transistor 7 is turned on but the N type transistor T6 is turned off, the page buffer 12 is maintained as its intact state. When the data of the memory cell read with the above method is stored in the page buffer 12, the lower and upper buffer latch signals φLatchL and φLatchH, and the sense amplification enable signal φSAE which are stored as the read data, are transitioned from the "high" level to the logic "low" level to thereby be disabled.

In addition to the transition of the sense amplification enable signal φSAE from the logic "high" level to the logic "low" level, the driving signal φRcyen (for enabling the lower read control signal φReadL, the complementary lower read control signal $\overline{\phi ReadL}$, and the upper read control signal φReadH, and the complementary upper read control signal $\overline{\phi ReadH}$ to enable the tri-state inverter G4) is toggled from the logic "low" level to the logic "high" level during the predetermined time. For this reason, the lower read control signal φReadL, the complementary lower read control signal $\overline{\phi ReadL}$, and the upper read control signal φReadH, and the complementary upper read control signal $\overline{\phi ReadH}$ are enabled, the data of the page buffer 12 is capable of being outputted by the external output signal, and the count signal Gsrst (indicating that the page read operation for the memory cell is completely performed once more) is transitioned from the logic "low" level to the logic "high" level. As a result, upon the page read operation, the upper buffer control signal $\overline{GSRH}$ (for controlling the page buffer 12 connected to the bit line selected by the upper column address signal) is transitioned from the logic "high" level to the logic "low" level and the read completion control signal φSfin (indicative of the completion of the page read operation) is toggled from the logic "low" level to the logic "high" level for a short time.

When the read completion control signal φSfin is toggled from the logic "low" level to the logic "high" level, the read operation signal Rop (indicating that the page read operation is under performance) is transitioned from the logic "high" level to the logic "low" level, the bit line control signal BLct1 (for maintaining the bit line below the shut off voltage level of the D type transistor T1) is transitioned from the logic "low" level to the logic "high" level, the page read operation is completed, and the data transmission for one page from the memory cell to the page buffer 12 is completed.

After that, a time interval between time M3 and time M4 is indicated as the time interval to output the data for the lower sub memory cell array 1A through the input/output terminals I/O. In the above time interval, when the data transmission for the selected one page is completed from the memory cell to the page buffer 12, the column address is increased by one by the toggle of the external read enable signal $\overline{REx}$. Consequently, the data can be consecutively and sequentially outputted by the toggle of the external read enable signal $\overline{REx}$. When the data transmission of the lower page buffer 12A connected to the bit line selected by the lower column address is completed while consequently and subsequently outputting the data in virtue of the toggle of the external read enable signal $\overline{REx}$, the column address sensing signal Hsay (indicative of a middle column address as the output of the column address sensing circuit 11 for sensing a middle column address 256 and a final column address 512) is transitioned from the logic "low" level to the logic "high" level.

Hereafter, a time interval between time M4 and time M5 is indicated as the time interval to transmit the data from the lower sub memory cell array 1A to the lower page buffer 12A, and a time interval between time M4 and time M6 is indicated as the time interval for outputting the data latched by the upper page buffer 12B to the input/output terminals I/O. In the above time interval between time M4 and time M5, when the column address sensing signal Hsay is transitioned from the logic "low" level to the logic "high" level, the external count-up signal XCNTup for increasing the row address is once toggled from the logic "low" level to the logic "high" level during the predetermined time period, thus to increase the row address, so that the next page (N+1th page) can be selected. As well, another page read enable signal φRen except for the address latch completion signal $\overline{ALEend}$ (for enabling the page read operation) is toggled from the logic "low" level to the logic "high" level, and thus the read operation signal Rop (indicating that the page read operation is under performance) is again transitioned from the logic "low" level to the logic "high" level. At this time, the external read enable signal $\overline{REx}$ is consecutively toggled and the data of the page buffer 12B (connected to the bit line selected by the upper column address) can be outputted regardless of enabling the page read operation for the next page.

In the time interval between time M4 and time M5, the bit line control signal BLctl (for maintaining the bit line level below the shut off voltage level of the D type transistor T1 upon the page read operation by way of the transition of the logic "high" level of the read operation signal Rop indicating that the page read operation is under performance) is transitioned from the logic "high" level to the logic "low" level. At this time, inasmuch as the upper buffer control signal $\overline{GSRH}$ (for controlling to enable the upper page buffer 12B connected to the bit line selected by the upper column address) stays at the logic "low" level, the lower isolation control signal φSBLL and the initialization control signal φDCB (for discharging the bit line and setting the lower page buffer 12A) are only enabled from the logic "low" level to the logic "high" level during the predetermined time period so that all of the bit lines can be discharged through the N type transistors T4 and T5 to the ground level. Thus, only the lower page buffer 12A connected to each of the bit lines selected by the lower column address can be set accordingly.

When the operations of discharging all of the bit lines and setting the lower page buffer 12A corresponding to the lower page are completed, the precharge control signal φPRE (for enabling precharge of the bit line and the sense amplification enable signal φSAE) is again transitioned from the logic "low" level to the logic "high" level. Once the precharge control signal φPRE and the sense amplification enable signal φSAE are transitioned from the logic "low" level to the logic "high" level (since the upper buffer control signal $\overline{GSRH}$ for controlling to enable the upper page buffer 12B connected to the bit line selected by the upper column address stays at the logic "low" level), the lower read control signal φReadL and the complementary lower read control signal $\overline{φReadL}$ (for enabling the tri-state inverter G4) are disabled and the voltage applied to the gate of the P type transistor T3 (connected to all of the bit lines) once more stays at the ground level, so that much current can be supplied to the bit line and again precharged to the shut off voltage level of the D type transistor T1 connected to all of the bit lines. Thus, all the data sensing lines S0–S511 are pulled to the level of the power supply voltage Vcc. As stated previously, after the bit line is adequately precharged, the bit line control signal BLctl is transitioned from the logic "high" level to the logic "low" level so that the voltage applied to the gate of the P type transistor T3 connected to all of bit lines can be increased from the ground level to the predetermined voltage level, thereby supplying only the infinitesimal current (Isense) to the bit line. Then, the bit lines which are precharged to the shut off voltage level of the D type transistor T1 determine their voltage level in the same manner as described above according to the data of the selected memory cell connected to the bit line. Thus, the data sensing lines S0–S511 go to the level of the power supply voltage Vcc or the ground level depending on the data of the selected memory cell.

When the voltage level of each data sensing line S0–S511 is determined as the data of the selected memory cell, the lower buffer latch signal φLatchL (among the lower and upper buffer latch signals φLatchL and φLatchH which store the read data in the page buffer 12) is enabled and then the selectively read data is stored only in the lower page buffer 12A connected to all of bit lines selected by the lower column address, in the same manner as explained hereinabove.

When the selectively read data is completely stored only in the lower page buffer 12A, the lower buffer latch signal φLatchL (for storing the read data in the lower page buffer 12A) and the sense amplification enable signal φSAE are transitioned from the logic "high" level to the logic "low" level to be disabled. As the sense amplification enable signal φSAE is transitioned from the logic "high" level to the logic "low" level, the lower read control signal φReadL and the complementary lower read control signal $\overline{φReadL}$ (for enabling the tri-state inverter G4) are enabled and the driving signal φRcyen (for enabling the lower read control signal φReadL), the complementary lower read control signal $\overline{φReadL}$, the upper read control signal φReadH and the complementary upper read control signal $\overline{φReadH}$ are again toggled from the logic "low" level to the logic "high" level during the predetermined time interval.

However, at this point, the lower read control signal φReadL, the complementary lower read control signal $\overline{φReadL}$, the upper read 10 control signal φReadH and the complementary upper read control signal $\overline{φReadH}$ (for enabling the tri-state inverter G4) are enabled prior to toggling the driving signal φRcyen. Also, because the count signal Gsrst indicating whether or not the page read operation is more than once performed stays at the logic "high" level, the read completion control signal φSfin (indicative of the completion of the page read operation) is toggled from the logic "low" level to the logic "high" level for a short time. When the read completion control signal φSfin is toggled from the logic "low" level to the logic "high" level, the read operation signal Rop (representing that the page read operation is under performance) is transitioned from the 20 logic "high" level to the logic "low" level, so that the bit line control signal BLctl (for maintaining the bit line level below the shut off voltage level of the D type transistor T1) can be transitioned from the logic "low" level to the logic "high" level. Consequently, the page read operation is completed, and the data transmission from the memory cell connected to the bit line selected by the lower column address for the N+1th page to the lower page buffer 12A connected to the bit line selected by the lower column address is completed.

Meanwhile, assuming that the cycle time of the serial access by the toggle of the external read enable signal $\overline{REx}$ is 50 ns and that the page read time is 3 μs (even though the data transmission from the memory cell connected to the bit line selected by the lower column address for the N+1th page to the lower page buffer 12A connected to the bit line selected by the lower column address is completed), the serial access of the data stored in the upper page buffer 12B connected to the bit line selected by the upper column address for the N+1th page is under performance.

When the serial access of the data stored in the upper page buffer 12B (connected to the bit line selected by the upper column address for the Nth page by the toggle of the external read enable signal $\overline{REx}$) is under performance and the final data is outputted, the column completion signal Fsay (as an output of the column address sensing circuit 11 for sensing the middle column address and the final column address) is transitioned from the logic "low" level to the logic "high" level. As a result, the operation for outputting the data stored in the upper page buffer 12B is performed in the time interval between time M4 and time M6. After that, a time interval between time M6 and time M7 is indicated as the time interval for performing the data transmission from the upper sub memory cell array 1B to the upper page buffer 12B, and the time interval after time M6 is indicative of the time interval for outputting the data latched to the lower page buffer 12A to the input/output terminals I/O. Thus, when the column completion signal Fsay (indicative of the final column address) is transitioned from the logic "low" level to the logic "high" level, the column start signal φFsay for resetting the column address is toggled from the logic "low" level to the logic "high" level during the predetermined time interval. In addition, when the column address counter is reset, the page read enable signal φRen for enabling the page read operation is toggled from the logic "low" level to the logic "high" level.

As the column address is reset, the column completion signal Fsay (indicative of the final column address) is transitioned from the logic "high" level to the logic "low" level, the upper buffer control signal $\overline{GSRH}$ is transitioned from the logic "low" level to the logic "high" level and the lower buffer control signal $\overline{GSRL}$ is transitioned from the logic "high" level to the logic "low" level. When the page read enable signal φRen for enabling the page read operation is toggled from the logic "low" level to the logic "high" level, the read operation signal Rop (indicating that the page read operation is under performance) is again transitioned from the logic "low" level to the logic "high" level. Here, the external read enable signal $\overline{REx}$ is sequentially toggled to output the data of the lower page buffer 12A. Thus, in this case, the data of the lower page buffer 12A is stored as the data of the memory cell connected to the bit line selected by the lower column address for the N+1th page.

Once the read operation signal Rop (representing that the page read operation is under performance) is again transitioned from the logic "low" level to the logic "high" level, the bit line control signal BLct1 (for maintaining the bit line level below the shut off voltage level of the D type transistor T1 upon the page read operation) is transitioned from the logic "high" level to the logic "low" level. As a consequence, the lower buffer control signal $\overline{GSRL}$ (for controlling the lower page buffer 12A) is transitioned to the logic "low" level. In addition, the upper buffer control signal $\overline{GSRH}$ (for controlling to enable the upper page buffer 12B) is transitioned to the logic "high" level. The lower isolation control signal φSBLL and the initialization control signal φDCB (for discharging the bit lines and setting the lower page buffer 12A) are also enabled from the logic "low" level to the logic "high" level during the predetermined time interval, to thereby discharge all of bit lines through the N type transistors T4 and T5 to the ground level. Further, when the upper page buffer 12B is completely set, the precharge control signal φPRE and the sense amplification enable signal φSAE are again transitioned from the logic "low" level to the logic "high" level.

As the precharge control signal φPRE and the sense amplification enable signal φSAE are transitioned from the logic "low" level to the logic "high" level (now that the lower buffer control signal $\overline{GSRL}$ for controlling to enable the lower page buffer 12A stays at the logic "low" level) the upper read control signals φReadH and the complementary upper read control signal $\overline{φReadH}$ (for enabling the tri-state inverter G4) are disabled. After that, the levels of the bit lines and the data sensing lines S0–S511 are respectively determined in the same way as described above.

Once each level of the bit lines and the data sensing lines S0–S511 is respectively determined therein, only the upper buffer latch signal φLatchH among the lower and upper buffer latch signals φLatchL and φLatchH (for storing the read data in the page buffer 12) is singly enabled, so that the data can be selectively read only in the upper page buffer 12B connected to the bit line selected by the upper column address, in the same way as described above. When the operation of storing the data selectively read only in the lower and upper page buffer 12B is completed, the upper buffer latch signal φLatchH (for storing the read data in the upper page buffer 12B) and the sense amplification enable signal φSAE are transitioned from the logic "high" level to the logic "low" level to be disabled. As the sense amplification enable signal φSAE is transitioned from the logic "high" level to the logic "low" level, the upper read control signal φReadH and the complementary upper read control signal $\overline{φReadH}$ (for enabling the tri-state inverter G4) are enabled.

The driving signal φRcyen (for enabling the lower read control signal φReadL), the complementary lower read control signal $\overline{φReadL}$, the upper read control signal φReadH and the complementary upper read control signal $\overline{φReadH}$ are also toggled from the logic "low" level to the logic "high" level during the predetermined time interval. However, the lower and upper read control signals φReadL, φReadH, $\overline{φReadH}$, and φReadH for enabling the tri-state inverter G4 are enabled prior to toggling the driving signal φRcyen. Moreover, since the count signal Gsrst (indicating whether or not the page read operation is to be performed) stays at the logic "high" level, the read completion control signal φSfin (representative of the page read operation) is toggled from the logic "low" level to the logic "high" level for the short time. When the read completion control signal φSfin is toggled from the logic "low" level to the logic "high" level, the read operation signal Rop (indicating that the page read operation is under performance) is transitioned from the logic "high" level to the logic "low" level. The bit line control signal BLct1 is also transitioned from the logic "low" level to the logic "high" level to set the bit line level below the shut off voltage level of the D type transistor T1. This completes the data transmission for the N+1th page from the memory cell connected to the bit line selected by the upper column address to the upper page buffer 12B connected to the bit line selected by the upper column address. Although the data transmission to the upper page buffer 12B is completed, the serial access of the data stored in the lower page buffer 12A connected to the bit line selected by the lower column address is under performance.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:

an array of memory cells arranged as a plurality of pages of memory cells electrically coupled to a respective plurality of word lines, a plurality of least significant columns of memory cells electrically coupled to a respective plurality of least significant bit lines and a plurality of most significant columns of memory cells electrically coupled to a respective plurality of most significant bit lines;

first and second subpage buffer means electrically coupled to the least significant bit lines and the most significant bit lines, respectively, for retaining a least significant portion and a most significant portion of a first byte of data read from a first page of memory cells, respectively;

an I/O data buffer; and read controller means, coupled to said first and second subpage buffer means, for initiating transfer of the first byte of data to said I/O data buffer and initiating an interleaved page read operation to read data from a subpage of memory cells in said array into one of said first and second subpage buffer means prior to transfer of the entire first byte of data to said I/O data buffer.

2. The integrated circuit memory device of claim 1, wherein said read controller means comprises means for initiating serial transfer of the first byte of data from said first and second subpage buffer means to said I/O data buffer and initiating an interleaved page read operation to read data from a subpage of memory cells in said array into said first subpage buffer means after serial transfer of the least significant portion of the first byte of data from said first subpage buffer means to said I/O data buffer, but before serial transfer of the entire most significant portion of the first byte of data from said second subpage buffer means to said I/O data buffer.

3. The integrated circuit memory device of claim 1, wherein said first subpage buffer means comprises a first latch circuit for sensing and storing the state of each memory cell in the first page which is electrically coupled to the least significant bit lines, during the first page read operation.

4. The integrated circuit memory device of claim 3, wherein said first latch circuit comprises a respective dual-inverter latch coupled to each of the least significant bit lines.

5. The integrated circuit memory device of claim 4, further comprising a first path unit containing a first plurality of tri-state inverters, and wherein an input of each of the first plurality of tri-state inverters is connected to an output of a respective dual-inverter latch in the first latch circuit.

6. The integrated circuit memory device of claim 5, further comprising a first column selection circuit containing a first plurality of pass transistors, and wherein each of the first plurality of pass transistors is electrically connected in series between an output of a respective tri-state inverter in the first path unit and said I/O data buffer.

7. The integrated circuit memory device of claim 6, wherein the number of least significant bit lines equals the number of most significant bit lines.

8. The integrated circuit memory device of claim 7, wherein none of the bit lines in the first plurality thereof is a bit line in the second plurality thereof.

9. An integrated circuit memory device, comprising:

a plurality of NAND strings of memory cells each containing a plurality of EEPROM transistors therein;

a plurality of word lines connected to respective EEPROM transistors in each of the NAND strings of memory cells to thereby define a respective plurality of pages of EEPROM transistors, each of said pages of EEPROM transistors having at least two subpages of EEPROM transistors therein;

an I/O data buffer; and reading/transmitting means, comprising a plurality of subpage buffers which are electrically coupled to said plurality of NAND strings of memory cells through respective bit lines, for reading data from a first subpage of EEPROM transistors in a first page thereof into one subpage buffer while simultaneously serially transmitting data read from a second subpage of EEPROM transistors in a second page thereof, from another subpage buffer to said I/O data buffer.

10. The integrated circuit memory device of claim 9, wherein each of the plurality of pages comprises first and second equal width subpages; and wherein said reading/transmitting means comprises means for sequentially reading data from the first and second subpages of each page one-at-a-time in alternating sequence into respective first and second subpage buffers while simultaneously serially transmitting data from the first and second subpage buffers to said I/O data buffer in an opposite alternating sequence so that while data is being read into the first subpage buffer data is also being serially transmitted from the second subpage buffer to said I/O data buffer and vice versa.

11. In an integrated circuit memory device containing an array of memory cells therein arranged as a plurality of addressable pages of predetermined length each having at least first and second nonoverlapping subpages, a method of transferring data from the memory cells to external the memory device, said method comprising the steps of:

reading data from memory cells in a first page at a first address into at least first and second subpage buffers; then transmitting data from the first subpage buffer to external the memory device; then transmitting data from the second subpage buffer to external the memory device while simultaneously reading data from memory cells in a first subpage of a second page at a second address into the first subpage buffer; and then transmitting data from the first subpage buffer to external the memory device while simultaneously reading data from memory cells in a second subpage of the second page at the second address into the second subpage buffer.

12. An integrated circuit memory device, comprising:

a memory array containing a plurality of pages of memory cells and a plurality of word lines, each of the word lines electrically coupled to a respective page of memory cells and each of the pages of memory cells containing a least significant subpage and a most significant subpage of memory cells therein;

an I/O data buffer;

first and second subpage buffers electrically coupled to the least and most significant subpages of memory cells in each of said plurality of pages of memory cells, respectively; and means, electrically coupled to said memory array and said first and second subpage buffers, for reading data from the least and most significant subpages of each page of memory cells one-at-a-time in alternating sequence into the first and second subpage buffers, while simultaneously serially transmitting data from the first and second subpage buffers to said I/O data buffer in an opposite alternating sequence so that while data is being read from a least significant subpage of memory into the first subpage buffer, data is also being serially transmitted from the second subpage buffer to said I/O data buffer and while data is being read from a most significant subpage of memory into the second subpage buffer, data is also being serially transmitted from the first subpage buffer to said I/O data buffer.

* * * * *